(12) United States Patent
Sodersjerna et al.

(10) Patent No.: US 8,615,076 B2
(45) Date of Patent: *Dec. 24, 2013

(54) WIRELESS DIGITAL SUBSCRIBER LINE DEVICE HAVING REDUCED RF INTERFERENCE

(75) Inventors: Roy Sodersjerna, Westford, MA (US); Jackie Lapierre, Oakland, CA (US); Philip Simmons, San Jose, CA (US)

(73) Assignee: Motorola Mobility LLC, Libertyville, IL (US)

( * ) Notice: Subject to any disclaimer, the term of this patent is extended or adjusted under 35 U.S.C. 154(b) by 166 days.

This patent is subject to a terminal disclaimer.

(21) Appl. No.: 12/976,659

(22) Filed: Dec. 22, 2010

(65) Prior Publication Data

US 2012/0008668 A1 Jan. 12, 2012

Related U.S. Application Data

(63) Continuation of application No. 10/949,584, filed on Sep. 24, 2004, now Pat. No. 7,881,463.

(60) Provisional application No. 60/506,287, filed on Sep. 26, 2003.

(51) Int. Cl.
*H04M 1/00* (2006.01)
*H04M 9/00* (2006.01)

(52) U.S. Cl.
USPC ............................. 379/413.03; 379/9.06

(58) Field of Classification Search
USPC .......................................... 379/413.03, 9.06
See application file for complete search history.

(56) References Cited

U.S. PATENT DOCUMENTS

| | | | | | |
|---|---|---|---|---|---|
| 5,107,404 | A | * | 4/1992 | Tam | 361/818 |
| 5,355,105 | A | * | 10/1994 | Angelucci, Sr. | 333/238 |
| 5,394,162 | A | * | 2/1995 | Korovesis et al. | 343/703 |
| 6,617,527 | B2 | * | 9/2003 | Ozeki et al. | 174/261 |
| 6,618,395 | B1 | * | 9/2003 | Kimmitt | 370/473 |
| 6,639,155 | B1 | * | 10/2003 | Bupp et al. | 174/260 |
| 6,781,553 | B2 | * | 8/2004 | Iguchi et al. | 343/725 |
| 6,836,023 | B2 | * | 12/2004 | Joshi et al. | 257/780 |
| 7,236,470 | B1 | * | 6/2007 | Bims | 370/328 |
| 7,436,270 | B2 | * | 10/2008 | Ratell et al. | 333/134 |

* cited by examiner

*Primary Examiner* — Alexander Jamal

(57) ABSTRACT

A system and method for wireless DSL routing without signal interference is disclosed herein. The system includes a DSL interface, a WLAN interface, and a power system. The WLAN interface is isolated from the rest of the system by various isolation and signal interference reduction techniques. The system can be implemented in a single printed circuit board.

14 Claims, 13 Drawing Sheets

WIRELESS DIGITAL SUBSCRIBER LINE DEVICE HAVING REDUCED RF INTERFERENCE

CROSS-REFERENCE TO RELATED APPLICATIONS

The present application claims priority to U.S. Provisional Application No. 60/506,287 filed Sep. 26, 2003, entitled "WIRELESS DIGITAL SUBSCRIBER LINE DEVICE HAVING REDUCED RF INTERFERENCE," and which is incorporated in its entirety herein.

BACKGROUND OF THE INVENTION

The present invention relates to broadband communications. More particularly, the present invention relates to digital subscriber line (DSL) communication systems.

Data communications is becoming increasingly prominent in business and homes. In particular, data communication needs via the Internet are increasing. For many years, Internet access occurred via telephone lines and analog modems. Analog modems can presently provide data communications at a maximum speed of 56 kbps (kilobits per second). Unfortunately, as the Internet becomes populated with graphics, video, sound, and other large-size data, Internet access via analog modems is insufficient to adequately meet user demand.

Fortunately, for users requiring greater modem speeds, faster data communications systems exist. For example, ISDN (Integrated Services Digital Network) provides speeds up to 128 kbps. DSL (Digital Subscriber Line) modems can provide data transfer at speeds of 1.5-8 Mbps (megabits per second).

As Internet use becomes commonplace and computer equipment prices have dramatically declined, a user may have more than one computing device or peripheral requiring Internet access in a given environment. Alternatively, the user may wish to have mobility within a given environment as he/she accesses the Internet. Such usage requirements give rise to a local area network (LAN) and/or a wireless local area network.

Accordingly, in order to provide a distributed network access to the Internet using DSL technology, functionalities for accessing the Internet via a telephone line, routing or bridging data to and from the telephone line and network, and interfacing with the network are required. Typically, such functionalities are provided by two or more discrete devices. Especially for wireless LANs, discrete devices aid in preventing signal interference and performance degradation.

As DSL usage becomes more popular, integrated DSL devices would be beneficial. Among others, integration would ease installation and device compatibility issues. Moreover, integration may provide cost savings for DSL consumers. To preserve the benefits of wireless LAN service, integrated DSL devices would benefit from reduction or elimination of signal interference between subcomponents while still providing data transfer speeds and uniform wireless coverage within the designated geographical area.

BRIEF SUMMARY OF THE INVENTION

An apparatus includes a DSL interface, a WLAN interface, and a power system for providing wireless Internet access at DSL speeds to one or more Internet accessing devices within a LAN. In one embodiment, the apparatus is implemented in a single printed integrated circuit board. RF interference is reduced or prevented by one or more techniques, such as but not limited to, metal shielding over a portion of the WLAN interface, impedance matching of the power amplifier and the antenna, and selective ground and power plane layout.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

BRIEF DESCRIPTION OF THE DRAWINGS

The exemplary embodiments will become more fully understood from the following detailed description, taken in conjunction with the accompanying drawings, wherein like reference numerals denote like elements, in which.

As is conventional in the field of circuit representation, sizes of electrical components are not drawn to scale, and various components may be enlarged or reduced to improve drawing legibility. Component details have been abstracted in the figures to exclude details such as position of components and certain precise connections between such components when such details are unnecessary to the invention.

DETAILED DESCRIPTION OF THE INVENTION

Described in detail below is a system and method for a digital subscriber line (DSL) device configured to include wireless local area network (WLAN) capabilities and minimal radio frequency (RF) interference that could reduce train rates and signal-to-noise ratios when measured against recognized industry test suites such as the DSL Forum TR-048.

In one embodiment, the DSL device comprises an integrated circuit (IC) board. The IC board is configured to include DSL modem functionalities, router or bridge functionalities, WLAN functionalities, and power system functionalities. One or more RF interference reduction techniques, such as but not limited to, metal shielding, selective ground and power plane circuit layout, and precise impedance matching, are utilized in the DSL device.

The following description provides specific details for a thorough understanding of, and enabling description for, embodiments of the invention. However, one skilled in the art will understand that the invention may be practiced without these details. In other instances, well-known structures and functions have not been shown or described in detail to avoid unnecessarily obscuring the description of the embodiments of the invention.

Figure 1:
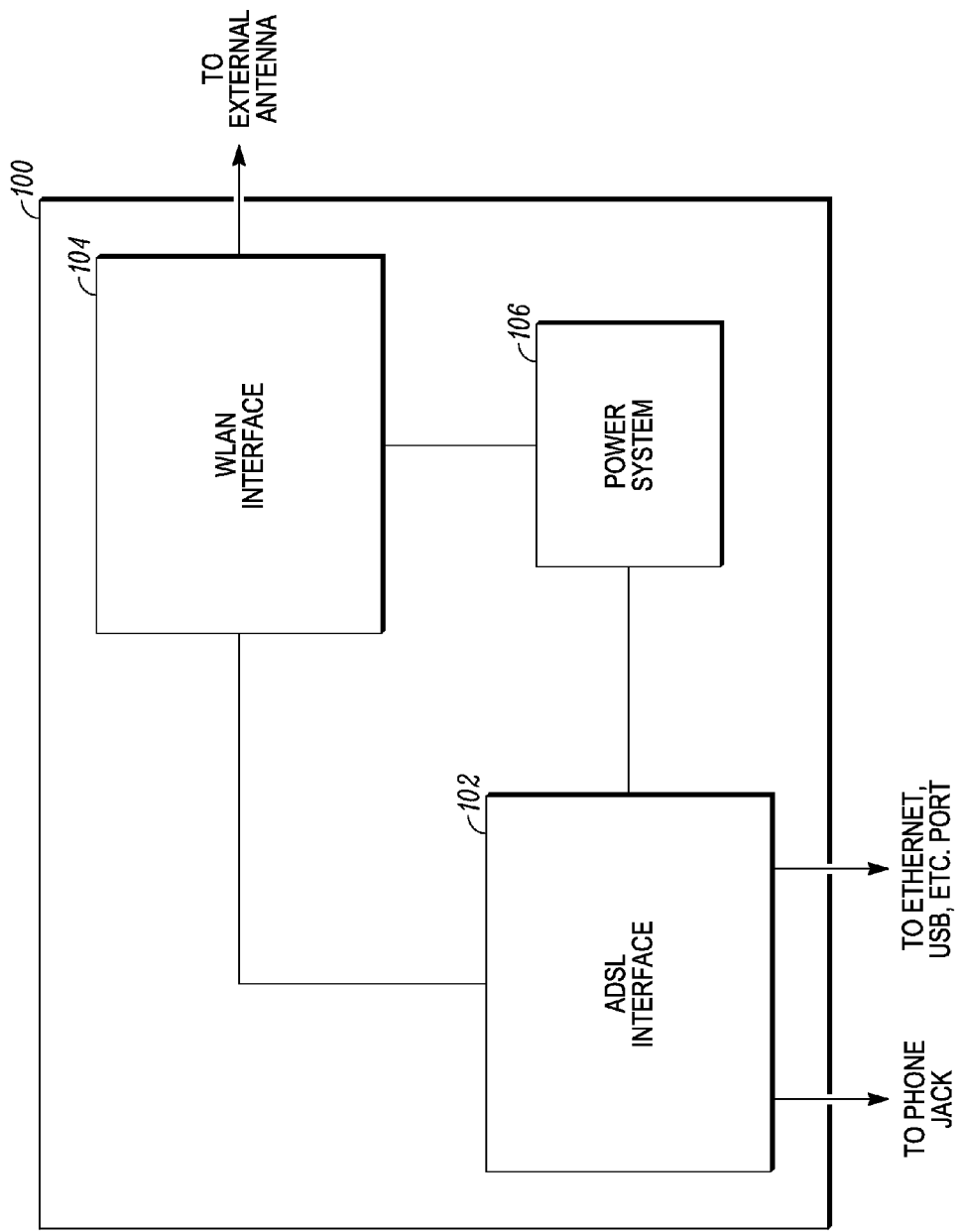
FIG. 1 is a block diagram of one embodiment of a DSL device.

Referring to FIG. 1, one embodiment of a DSL device 100 is shown. The DSL device 100, also referred to as a wireless DSL router or DSL customer premises equipment (CPE), is configured to be used at a business or home to provide DSL service to one or more Internet accessing devices within the LAN. In FIG. 1, the DSL device 100 provides asymmetric digital subscriber line (ADSL) service. However, in alternative embodiments, the DSL device 100 may be configured to provide ADSL-lite, rate adaptive digital subscriber line (R-ADSL), high-speed digital subscriber line (HDSL), symmetrical digital subscriber line (SDSL), very high-speed digital subscriber line (VDSL), other DSL-type service, broadband service, or high speed Internet access.

The DSL device 100 includes an ADSL interface 102, a WLAN interface 104, and a power system 106. The ADSL interface 102 is electrically coupled to the WLAN interface 104. The power system 106 is electrically coupled to each of the ADSL interface 102 and the WLAN interface 104.

The ADSL interface 102, to be described in detail below, is configured to connect to a phone jack and to an Ethernet, USB, or other port of an Internet accessing device (e.g., personal computer, laptop, etc.). The ADSL interface 102 is further configured to modulate/demodulate, process, and route data transmitted to and received from the Internet. The ADSL interface 102 provides a broadband connection to the Internet.

The WLAN interface 104, also referred to as a wireless interface, is configured to wirelessly transmit and receive data via an internal or external antenna. In one embodiment, the wireless range is at least approximately 200 meters, broadcasts in the RF frequency range, and is a WLAN based on IEEE 802.11 specifications.

The power system 106, also referred to as a power interface, is configured to supply appropriate power to the circuits, semiconductor chips, and other components within the DSL device 100. The power system 106 may be coupled to one or more external power supplies.

Figure 2:
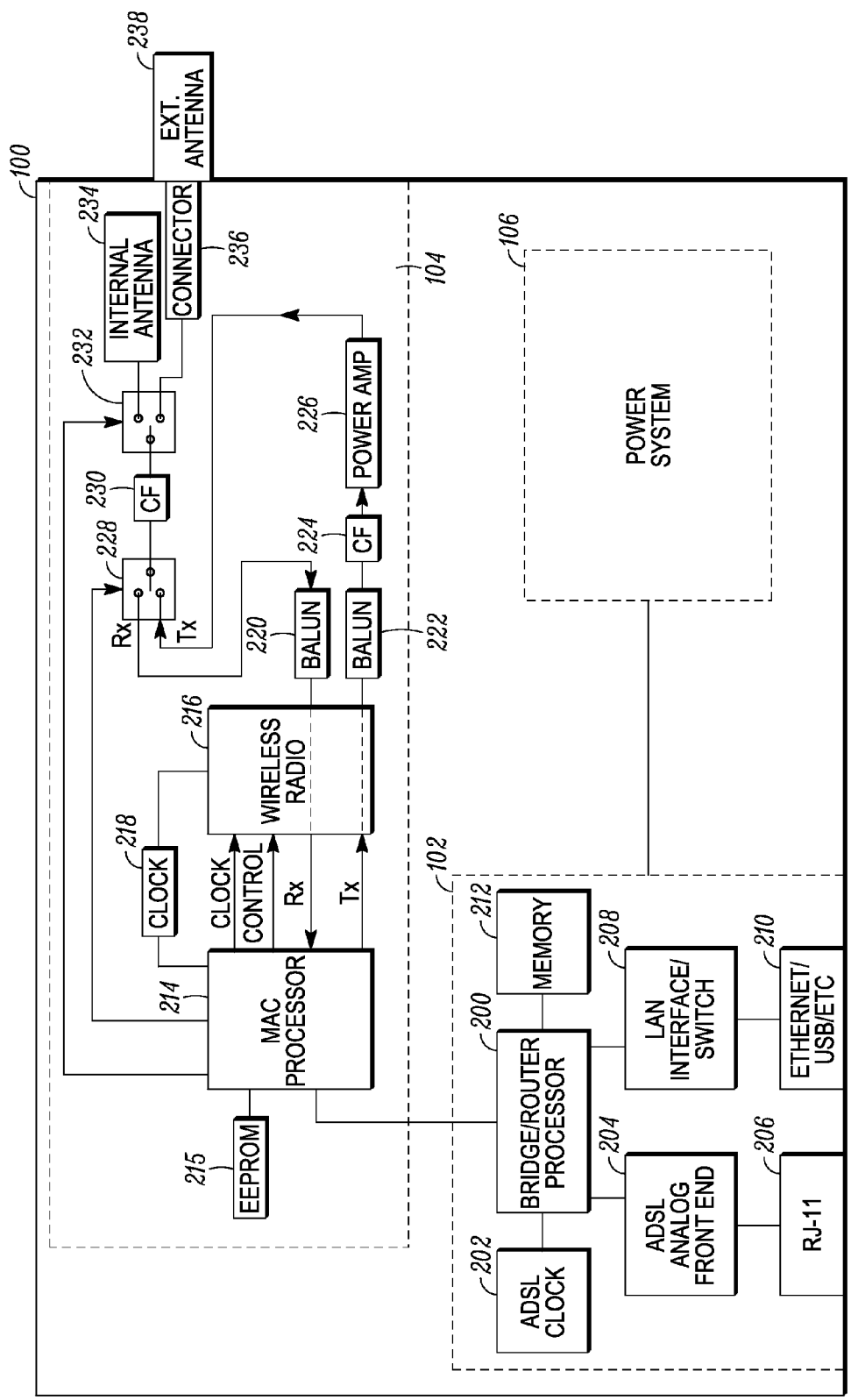
FIG. 2 is a detailed block diagram of the DSL device shown in FIG. 1.
Figure 3:
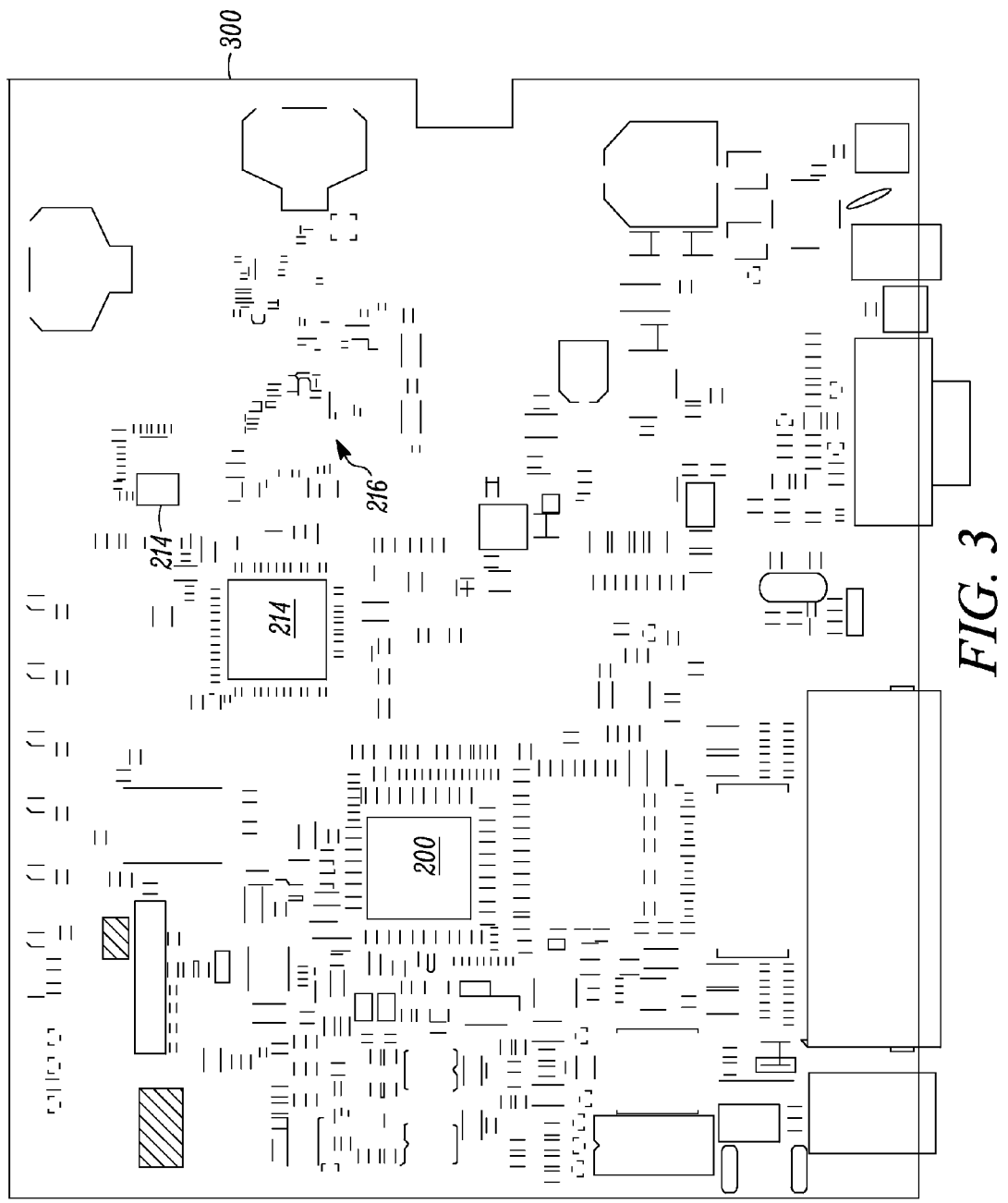
FIG. 3 is a top view of a first layer of a printed circuit board (PCB) implementation of the DSL device of FIG. 1.
Figure 4:
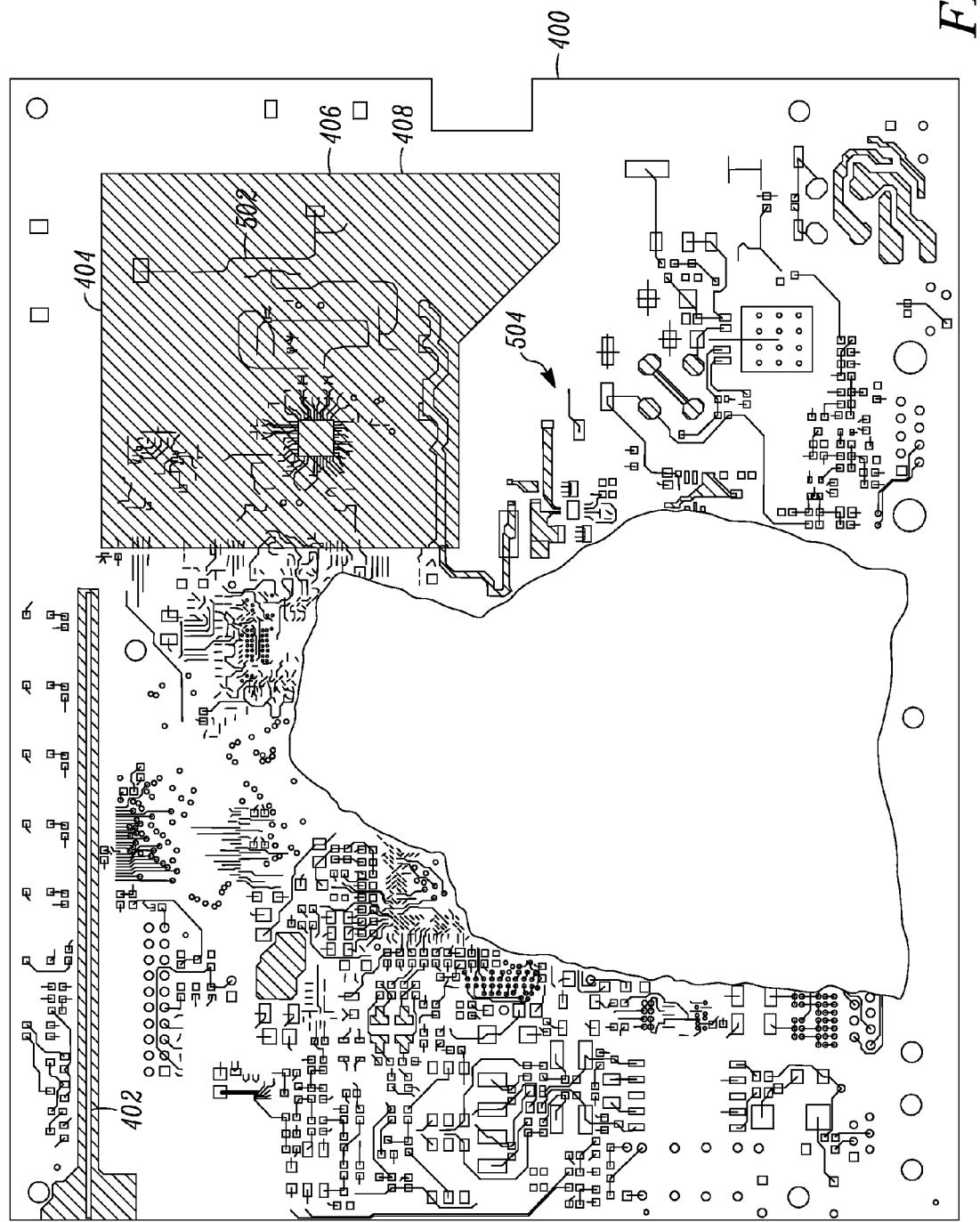
FIG. 4 is a top view of a second layer of the PCB implementation of the DSL device of FIG. 1.

Referring to FIG. 2, a detailed block diagram of the DSL device 100 is shown. The ADSL interface 102 comprises a processor 200 electrically coupled to each of an ADSL clock 202, an ADSL analog front end 204, a LAN interface(s) 208, and a memory 212. The ADSL interface 102 further comprises a RJ-11 connector 206 coupled to the ADSL analog front end 204, and an interface connector 210 coupled to the LAN interface(s) 208.

The processor 200 and the ADSL analog front end 204, except the hybrid circuit, inside/outside pair switch, and line protection devices (not shown), can be implemented by a Conexant CX82310 processor chip. The Conexant chip functions as a bridge or router to perform packet forwarding and filtering of downstream and upstream data signals. The Conexant chip supports T1.413 Issue 2, G.992.1 (G.dmt) Annex A, and G.992.2 (G.lite). With T1.413 and G.992.1, downstream rates of up to 8 Mbps and upstream rates of up to 1 Mbps in 32 kbps increments are supported. For G.992.2, downstream rates of up to 1.5 Mbps and upstream rates of up to 512 kbps in 32 kbps increments are supported. In an alternative embodiment, G.992.1 Annex B or other modes may be supported.

The ADSL clock 202 is a processor clock derived from a 35.328 MHz crystal oscillator. The ADSL clock 202 is also the basis for the ADSL digital signal processing (DSP) sampling rate generation in the interface 102. The memory 212 comprises a 2 MB flash memory and 8 MB of synchronous dynamic random access memory (SDRAM).

The LAN interface(s) 208 is configured to provide full or half duplex 10/100 Base-T according to IEEE 802.3u. A media independent interface (not shown) provides the connection to the processor 200 and the physical layer circuit for the LAN interface(s) 208. For example, when the LAN interface(s) 208 is an Ethernet switch, the LAN interface(s) 208 may be a Broadcom BCM5325M 4-port switch.

The RJ-11 connector 206 is configured to provide a connection point between the telephone jack and the device 100. The connector 210 is configured to provide an Ethernet, USB, or other similar connection point to an Internet accessing device.

The interface 102 is further configured to support trellis coding, frequency division multiplexing (FDM), echo cancellation (EC) modes, and framing modes 0, 1, 2, and 3.

The WLAN interface 104 comprises a wireless media access control (MAC) and baseband processor 214, a EEPROM 215, a wireless radio 216, a clock 218, a balun transformer 220, a balun transformer 222, a filter 224, a power amplifier 226, a first antenna switch 228, a filter 230, a second antenna switch 232, an internal antenna 234, a connector 236, and an external antenna 238. Each of the EEPROM 215, clock 218, radio 216, power amplifier 226, first antenna switch 228, and second antenna switch 232 is electrically coupled to the MAC processor 214. On the transmit path, to be described in detail below, the balun transformer 222 is electrically coupled between the radio 21 and the filter 224. The power amplifier 226 is electrically coupled between the filter 224 and the first antenna switch 228. On the receive path, to be described in detail below, the balun transformer 220 is electrically coupled between the radio 216 and the first antenna switch 228. The filter 230 is electrically coupled between the first and second antenna switches 228, 232. Each of the internal antenna 234 and the external antenna 238 (via the connector 236) is electrically coupled to the second antenna switch 232.

The MAC processor 214 is configured to provide MAC functionality, IEEE 802.11b scan and join operations, hardware wired equivalent privacy (WEP) encryption/decryption, data traffic direct memory access (DMA), and transmit and receive queuing (using an on-chip SRAM). In the baseband processor portion of the MAC processor 214, functionalities such as transmit and receive modulation, long and short physical-layer convergence protocol (PLCP) support, Barker algorithms, CCK algorithms, PBCC algorithms, access point beacon generation, and conversion between encoded data and analog I and Q signals are provided.

In one embodiment, the MAC processor 214 may be a Texas Instruments ACX100 MAC and baseband processor chip. The chip is implemented in a 257-pin ball grid array (BGA); at 1.8 Volts, 2.85 Volts, and 3.3 Volts power levels; and with joint test action group (JTAG) boundary scan.

The MAC processor 214 is clocked from the clock 218. The clock 218 is configured to be a 22 MHz buffered crystal oscillator. The EEPROM 215 is a two-wire serial EEPROM configured to allow configuration options to be set under hardware control. For example, the MAC address, localized transmit power levels, oscillator calibration adjustment parameters, and adjacent channel power ratio bias settings can be included in the EEPROM 215.

The MAC processor 214 is set to be in generic-slave mode, and is a bus slave to the processor 200 for read and write transactions. A 16-bit memory interface (not shown) is provided between the MAC processor 214 and the processor 200 for this purpose. The memory interface is set to Little-endian mode. The MAC processor 214 may be configured without flash memory, the necessary code being downloaded from the processor 200 on initialization. An open-drain active low interrupt is provided from the MAC processor 214 to the processor 200.

The MAC processor 214 and the radio 216 are configured to modulate and demodulate analog I and Q signals from the radio carrier signal. A serial control line from the MAC processor 214 provides programmable settings to the radio 216.

The radio 216, also referred to as a transceiver or RF transceiver, is configured to provide up and down conversion. As an example, the radio 216 can be a Maxim MAX2820 radio transceiver chip. The clock 218 is utilized as the radio 216's VCO clock source. The Maxim MAX 2820 radio chip is powered by 2.85 Volts.

The power amplifier 226 is configured to provide power feedback bias control to the MAC processor 214. This feedback bias control permits the digital-to-analog converter (DAC) to be adjusted so that current can be reduced while maintaining adjacent channel power ratio (ACPR) performance. The power amplifier 226 is also configured to provide a fixed gain of 28 dB for the data to be transmitted. As an example, the power amplifier 226 can be a Maxim MAX 2242 power amplifier chip, powered by a 5.0 Volts power source. The Maxim MAX2242 chip uses an ultra chip scale package (UCSP).

The radio 216 and the power amplifier 226 comprise an IEEE 802.11b radio or RF modulator/demodulator. The IEEE 802.11b radio and the MAC processor 214 comprise an IEEE 802.11b interface for spread spectrum WLAN.

In the radio transmit path, analog baseband data from the MAC processor 214 is inputted to the radio 216. The radio 216 modulates the received baseband data onto a carrier signal that is in the 2.4 GHz band. The carrier signal is generated by a synthesizer included in the radio 216. The resulting modulated carrier is provided as a differential signal at the output pins of the radio 216.

This differential signal is converted to a single ended signal by the balun transformer 222. The single ended signal outputted from the balun transformer 222 is filtered by the filter 224 before entering the power amplifier 226. The filter 224 can be a ceramic filter having a maximum linear output power of 20 dBm.

The feedback path from the power amplifier 226 to the MAC processor 214 permits the MAC processor 214 to measure the actual RF power of the filtered single ended signal and accordingly adjust the transmit gain in the power amplifier 226. Depending on the actual RF power measured, the MAC processor 214 can increase or decrease the power amplifier 226 output.

After the filtered single ended signal has been appropriately amplified by the power amplifier 226, the outputted transmit signal is provided to the first antenna switch 288, the filter 230, and then to the second antenna switch 232. The first antenna switch 228 is configured to be in a transmit path or receive path position, based on a control signal from the MAC processor 214. In this instance, the first antenna switch 228 is set to the transmit path. The transmit signal is hence passed through and is further filtered by the filter 230. The filter 230 can be a ceramic filter with bandpass filtering characteristics in the 2.4-2.5 GHz range.

Finally, the transmit signal is broadcast or transmitted by the internal or external antenna 234 or 238. The antenna selection is specified by the position of the second antenna switch 232. The second antenna switch 232 is controlled by the MAC processor 214.

Each of the antennas 234, 238 includes an RF-type switch that is switchable by appropriate RF signals from the MAC processor 214. The internal antenna 234 is mounted directly onto the printed circuit board (PCB) of the device 100. As an example, the internal antenna 234 can be a SkyCross SMT-2T06-M tri-band omni-directional antenna that operates in the range of 2.4-5.9 GHz and a gain of 3.75 dBi. The external antenna 238 is external to the packaging comprising the device 100, and is mounted to the packaging via the connector 236. An example of the external antenna 238 is the Nearson S131CL-L-RMM-2450S half wave dipole omni-directional antenna that operates in the range of 2.4-2.5 GHz and a gain of 2 dBi.

In the receive path, wireless RF signals are received by the device 100 via one of the antennas 234, 238. The MAC processor 214 monitors factors such as signal strength, signal to noise ratio, etc. to determine which antenna to utilize. This antenna selection capability provides antenna diversity. The RF signals are generated and broadcast by one or more Internet accessing device within the geographic area covered by the WLAN. The received RF signal passes through the second antenna switch 232, the filter 230, and then the first antenna switch 228 (the first antenna switch 228 being set to the receive path position).

Next, the received signal is converted from single ended to differential form by the balun transformer 220. The differential signal is the input to the radio 216. Within the radio 216, the differential signal is amplified and mixed with a local oscillator signal to demodulate to a baseband signal. The frequency of the local oscillator varies depending on the IEEE 802.11b channel selected.

The baseband signal is inputted to the MAC processor 214 from the radio 216. The MAC processor 214 processes the received baseband signal in preparation of inputting to the processor 200. The MAC processor 214 also controls the receive path gain in the radio 216 to prevent the radio 216 from clipping the received signal in the baseband analog to digital conversion stage. The baseband A/D conversion stage expects the received signal with maximum peak-to-peak amplitude of 250 mV.

It should be understood that certain circuits and/or devices, such as but not limited to, relays, transformers, line protection circuitry, power on reset circuitry, light emitting diodes (LEDs), etc. are included in the device 100 to facilitate operation of processor chips, switches, etc. Such circuits and/or devices, nevertheless, are not shown so as not to obscure the components discussed herein and as they are well-known in the art.

The block diagrams shown in FIGS. 1 and 2 are roughly representative of the physical implementation of the different functionalities of the device 100 on a printed integrated circuit board. The device 100 can be implemented in a single printed integrated circuit board (also referred to as a printed circuit board (PCB) or integrated circuit (IC) board). In one embodiment, FIGS. 3-9 illustrate a PCB implementation of the device 100. FIGS. 3-9 show a first, second, third, fourth, fifth, sixth, and seventh layers 300, 400, 500, 600, 700, 800, and 900, respectively, of the PCB. The layer 300 of FIG. 3 comprises a silkscreen.

In the layers 300-900 shown in FIGS. 3-9, portions of one or more layers are not shown and/or abstracted for ease of discussion. Approximately the top right quadrant of all the layers corresponds to the WLAN interface 104. Approximately the left side of all the layers corresponds to the ADSL interface 102. Approximately the bottom right quadrant of all the layers corresponds to the power system 106. The layers 400-900 are overlaid on top of each other, with the layer 400 being the top layer, layers 500-800 being the intermediate layers, and the layer 900 being the bottom layer. The layers 500-800 are also referred to as sub layers of the PCB. The layers 400-900 will be described in greater detail herein with respect to FIG. 10.

Figure 10:
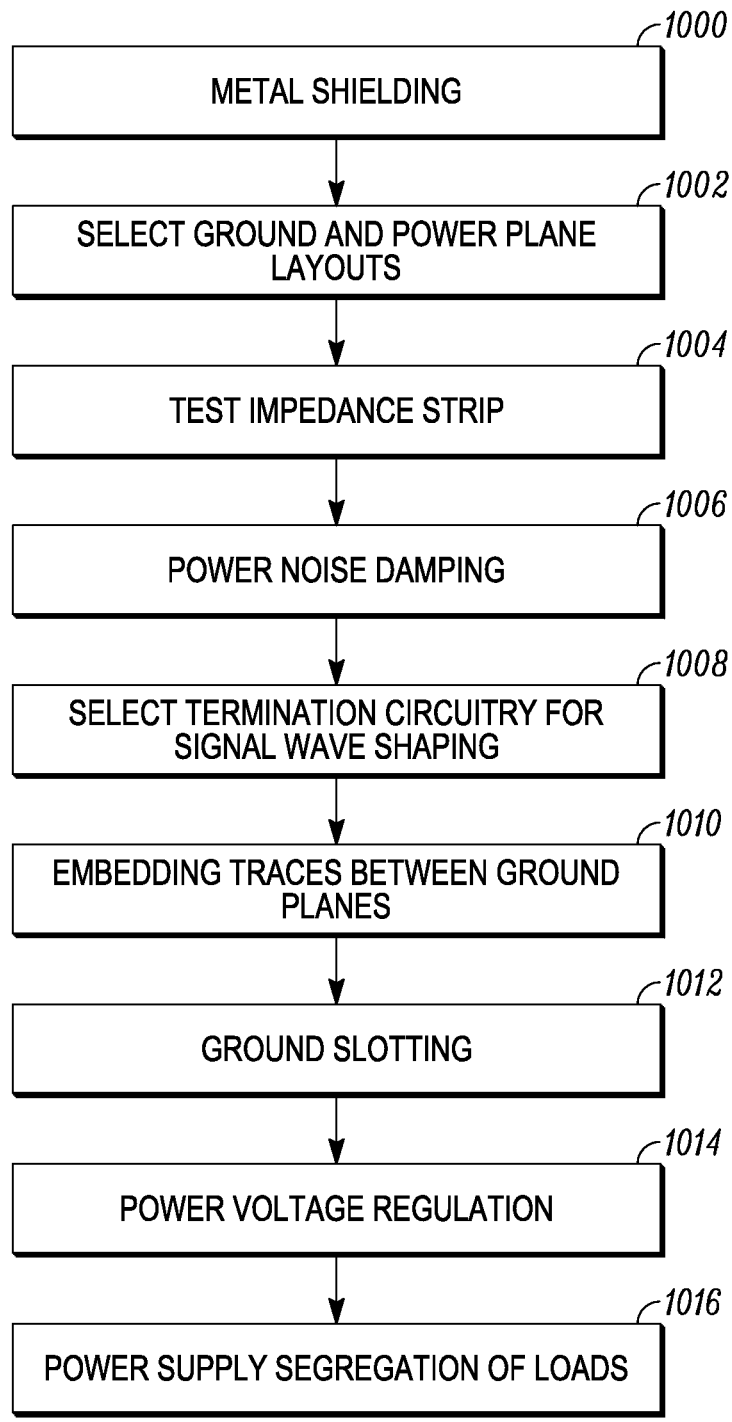
FIG. 10 is a process flow of the signal interference reduction techniques employed in the DSL device of FIG. 1.

Various design or implementation techniques are utilized to provide the ADSL interface 102, WLAN interface 104, and power system 106 on the same PCB without RF interference affecting performance. In FIG. 10, techniques used to isolate or prevent RF interference at the PCB are shown. Techniques include a metal shielding block 1000, a select ground and power plane layout block 1002, a test impedance strip block 1004, a power noise damping block 1006, a select termination circuitry for signal wave shaping block 1008, an embedding traces between ground planes block 1010, a ground slotting block 1012, a power voltage regulation block 1014, and a power supply segregation of loads block 1016. It should be understood that blocks 1000-1016 can be performed in any order, two or more techniques can be performed simultaneously, and one or more technique may be omitted depending on design considerations and performance parameters desired.

With respect to the metal shielding block 1000, a first metal shield is provided around the radio 216, power amplifier 226, and associated circuitry; and a second metal shield is provided around the clock 218 and its associated clock circuitry. Both metal shields are comprised of cold rolled steel having a thickness of 0.20 mm. Both metal shields are provided at the layer 400 of the PCB. Each of the metal shields includes a top and sides to fully encapsulate the tops and sides of the structures of the device 100 discussed above. For the underside of the structures, a ground plane is utilized within the PCB sub layers or substructures to provide underside shielding.

With respect to the select ground and power plane layout block 1002, an isolation (or wireless) area 502 and a main (or digital) area 504 are configured in the PCB. The isolation area 502 and the main area 504 (easiest to see in FIG. 5) are present in the layers 400-900. The dark areas denote a ground plane and the light areas denote absence of copper areas (e.g., non-ground plane). For a given isolation or main area, a power plane may be placed in the layer above or below a layer containing a ground plane. Thus, for example, the main area 504 can comprise a sandwich structure of alternating power and ground planes. In the layer 400, the main area 504 is a power supply block and is positioned directly above the main area 504 of the layer 500, which is a ground plane.

Figure 6:
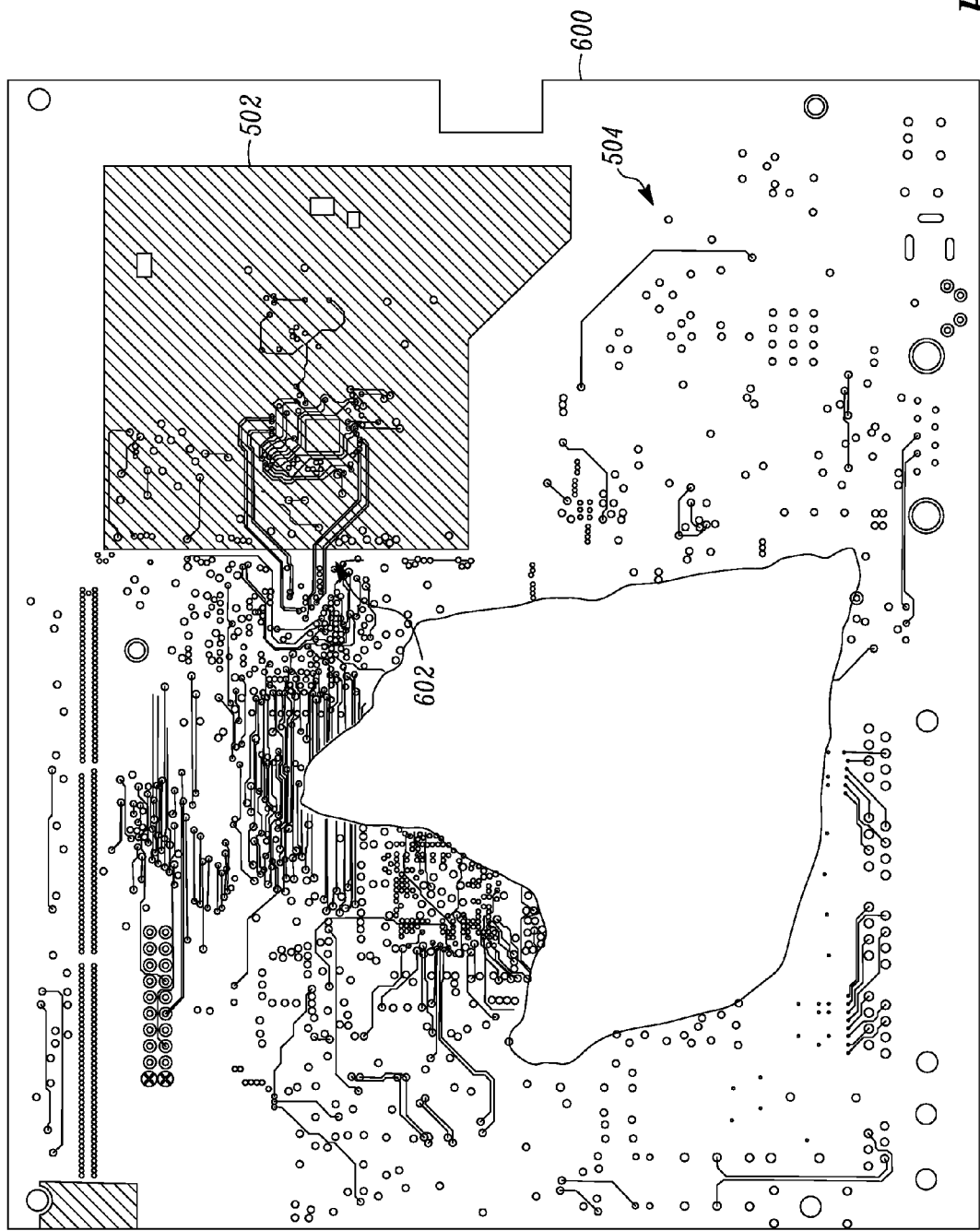
FIG. 6 is a top view of a fourth layer of the PCB implementation of the DSL device of FIG. 1.
Figure 7:
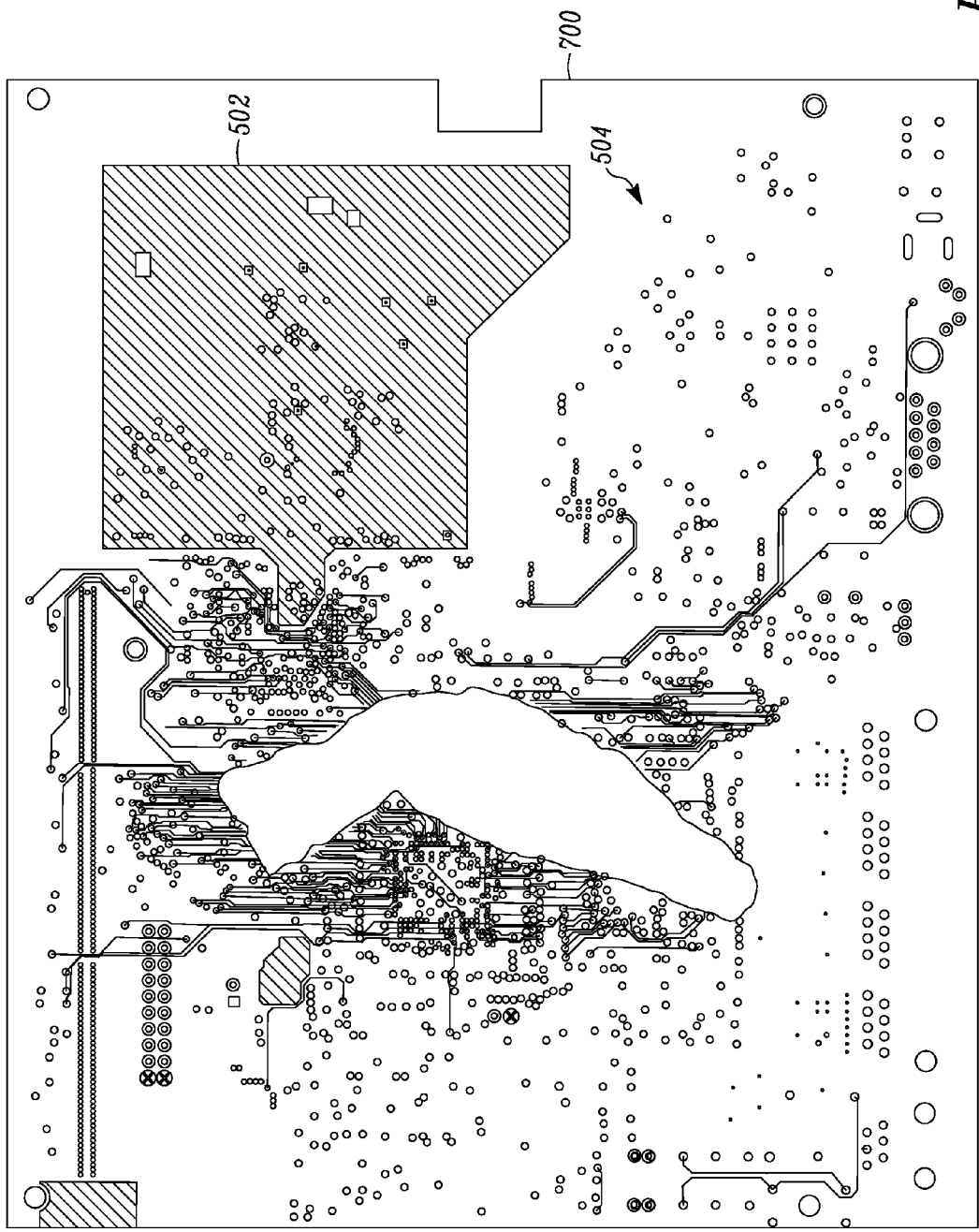
FIG. 7 is a top view of a fifth layer of the PCB implementation of the DSL device of FIG. 1.
Figure 8:
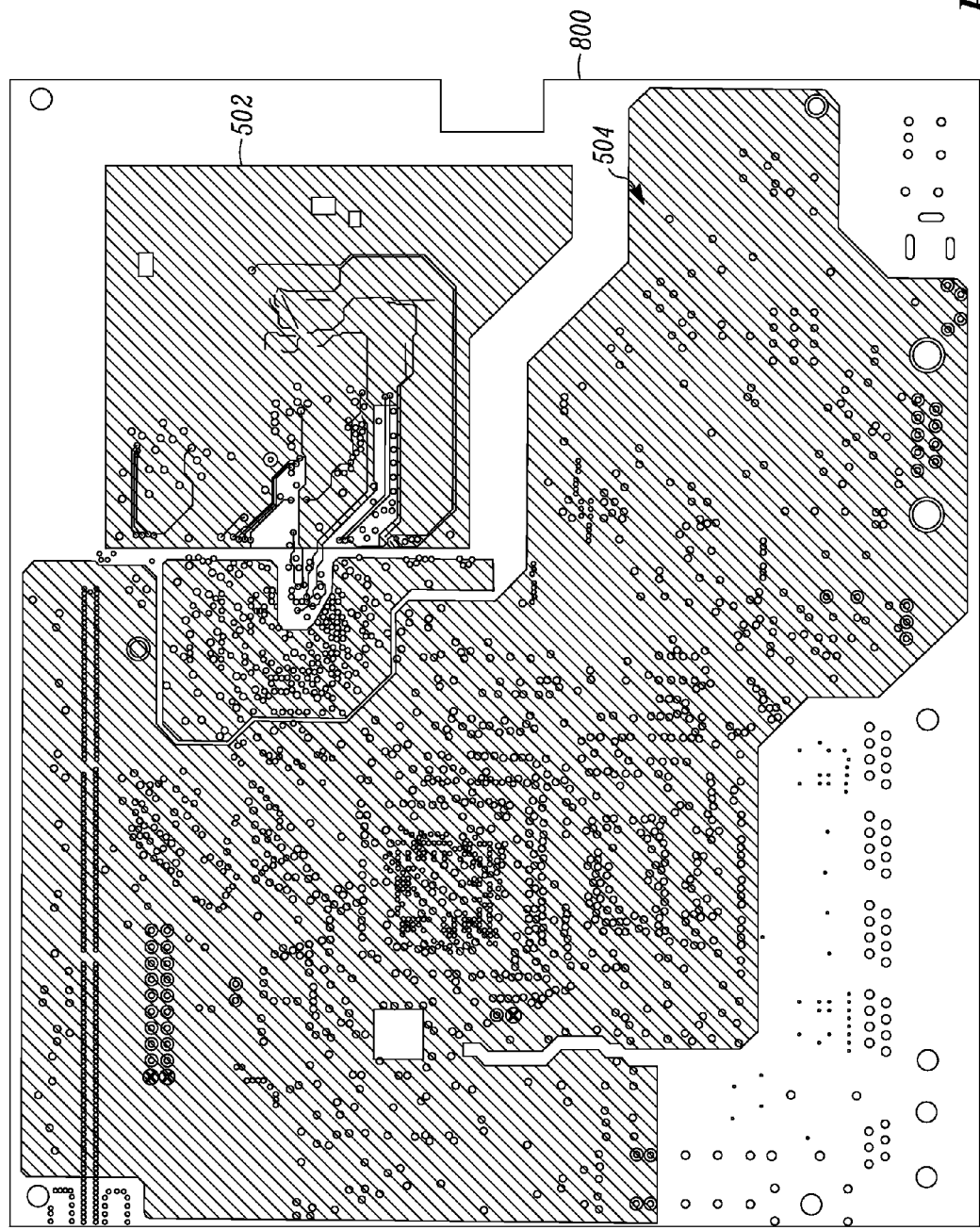
FIG. 8 is a top view of a sixth layer of the PCB implementation of the DSL device of FIG. 1.
Figure 9:
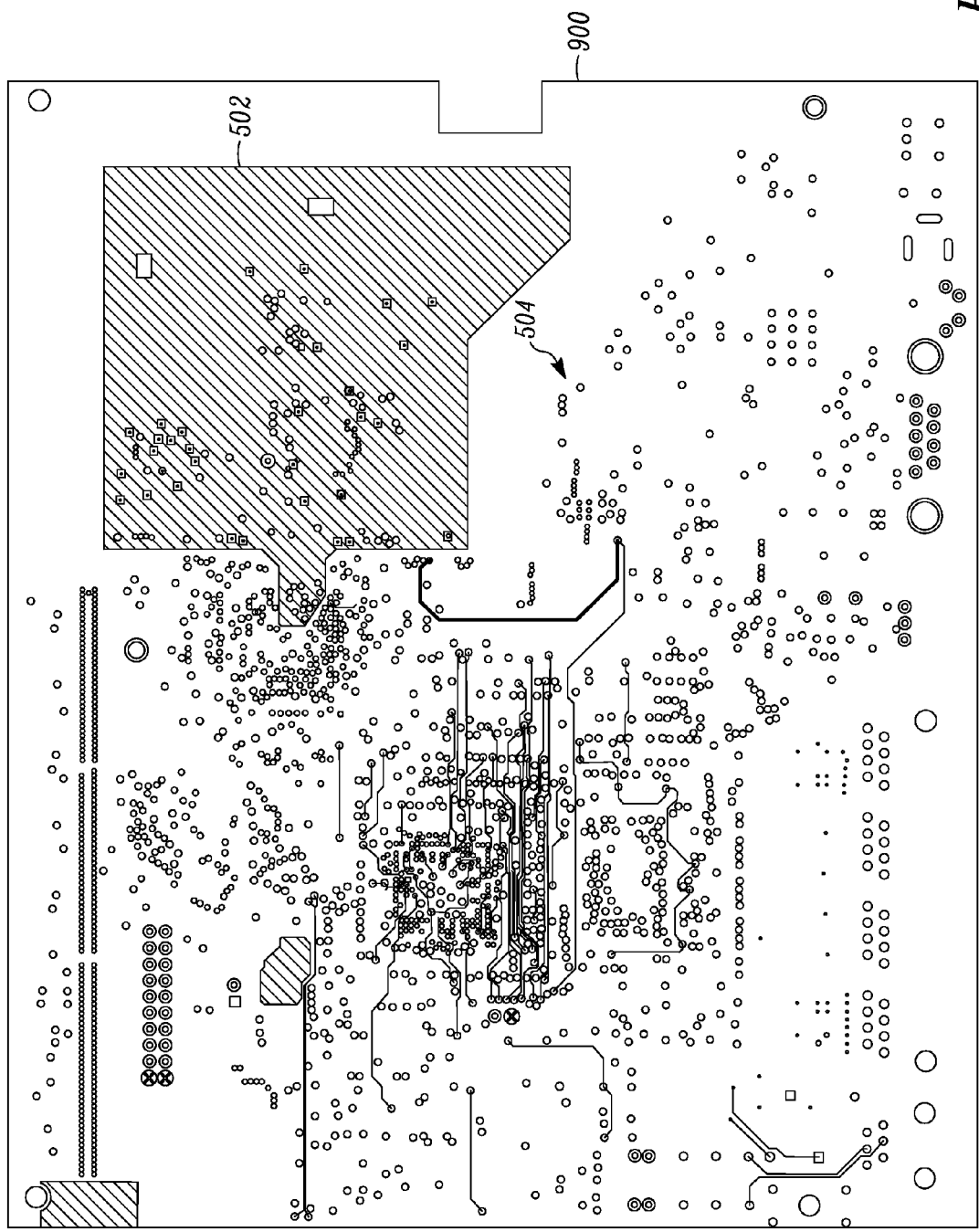
FIG. 9 is a top view of a seventh layer of the PCB implementation of the DSL device of FIG. 1.

The isolation area 502 is physically and electrically isolated from the main area 504. The gap dimension between the isolation area 502 and the main area 504 is approximately 0.025 inches. The MAC processor 214 is included in the main area 504. As shown in FIG. 6, traces 602 are configured to electrically couple the isolation area 502 to the main area 504, and more particularly, the clock 218 and the radio 216 to the MAC processor 214.

Next, with respect to the test impedance strip block 1004, a test impedance strip 402 is included in the layer 400. The strip 402 is positioned from the left edge of the layer 400 and extends about halfway across the layer 400. The strip 402 is configured to measure the exact impedance of the PCB using time domain reflectometry techniques. Based on the measured impedance, the resistive and capacitive values, and correspondingly, the thickness of each trace on the PCB is determined and accurately laid down. Moreover, using channelized co-planar waveguide transmission line techniques, traces 404, 406, and 408 connecting the antennas 234, 238 to the radio 216 can be laid down with the exact desired impedance.

For example, if the measured PCB impedance is 50 ohms, then the trace impedance is also laid down to be at 50 ohms. The measurement using the strip 402 occurs before the traces are laid down and periodically during the manufacturing process to ensure that the impedance match is maintained. For example, a measurement during the manufacturing process is implemented to provide impedance matching of the power amplifier 226 to the antennas 234, 238.

Figure 11:
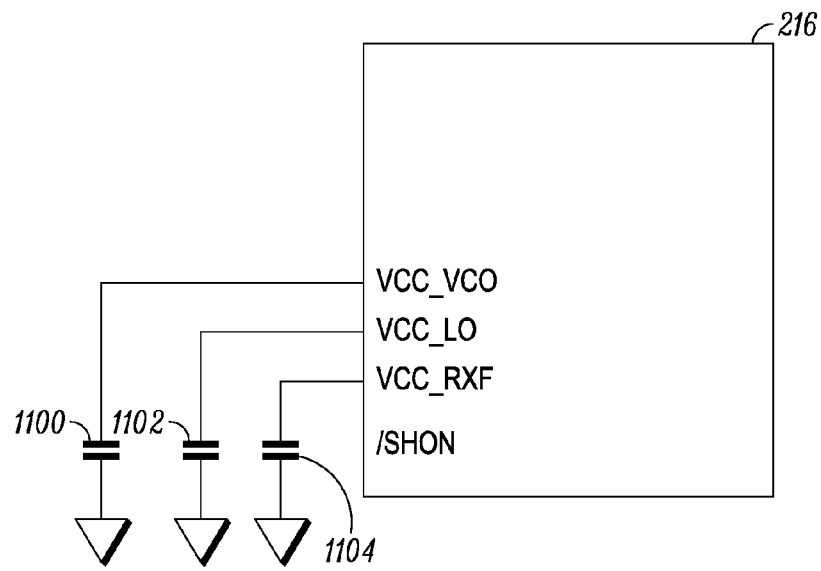
FIG. 11 is a circuit diagram showing bypass capacitors associated with a radio included in the DSL device of FIG. 1.
Figure 12:
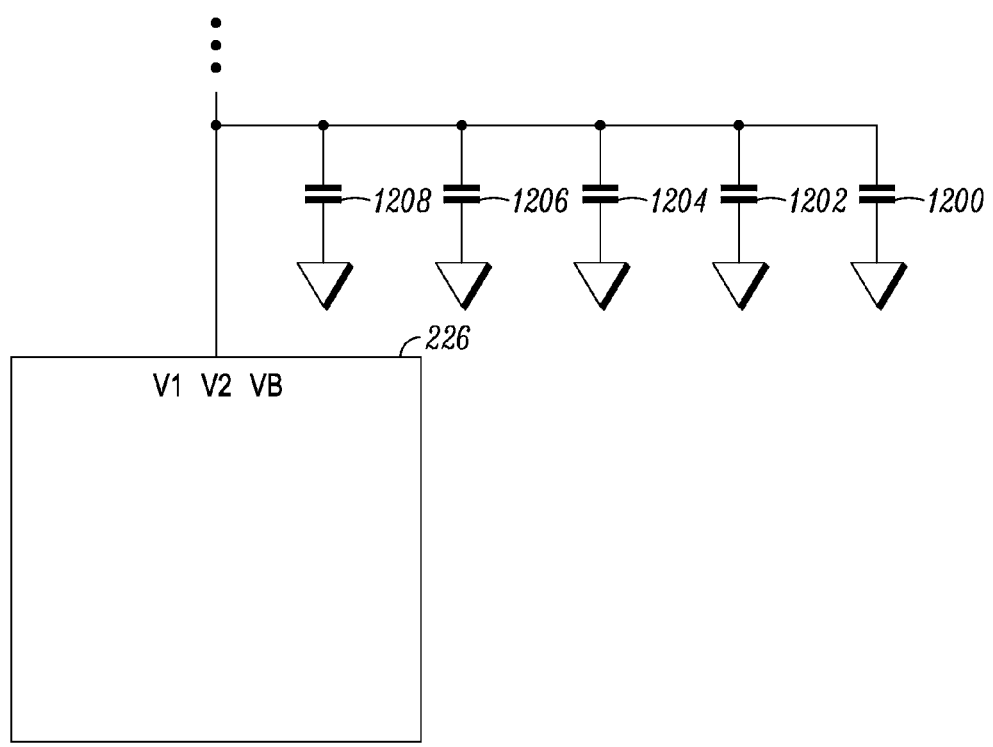
FIG. 12 is a circuit diagram showing bypass capacitors associated with a power amplifier included in the DSL device of FIG. 1.

With respect to the power noise damping block 1006, capacitors 1100, 1102 and 1104 are provided at pinout positions VCC_VCO, VCC_LO, and VCC_RXF of the radio 216 (see FIG. 11). Each of the capacitors 1100, 1102, and 1104 has a capacitance of 10 nF. Capacitors 1200, 1202, 1204, 1206 and 1208 are provided in parallel at pinout position V2 of the power amplifier 226 (see FIG. 12). Each of parallel capacitors 1200, 1202, 1204, 1206, and 1208 has a capacitance of 100 nF. The capacitors 1100-1208 are placed close to its respective chip (the radio 216 or the power amplifier 226) on the layer 100 of the PCB. The distance between each capacitor and its respective chip can be a few millimeters. The short distance and capacitive values aid in power noise damping of the radio 216 and the power amplifier 226.

Figure 13:
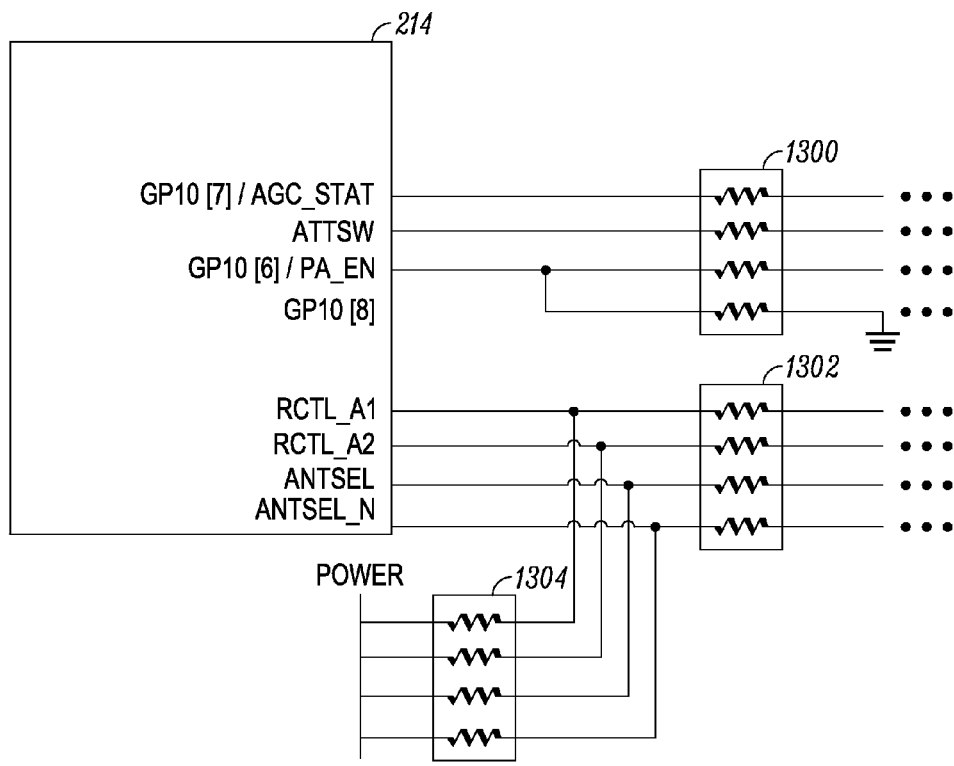
FIG. 13 is a circuit diagram showing a termination resistive packs associated with a MAC processor included in the DSL device of FIG. 1.
Figure 14:
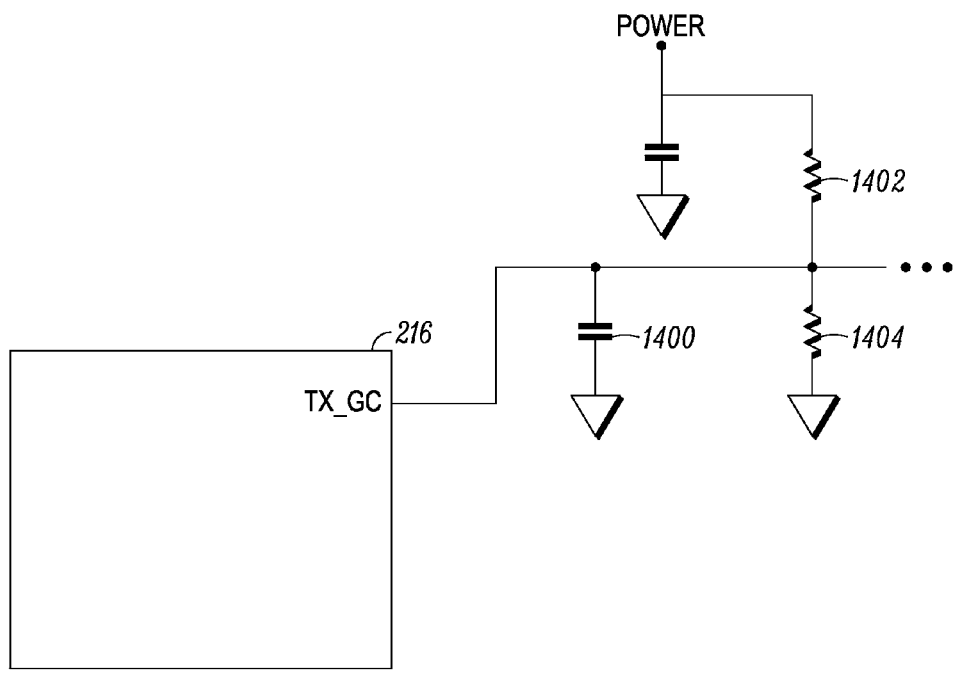
FIG. 14 is a circuit diagram showing a termination network associated with the radio included in the DSL device of FIG. 1.

At the select termination circuitry block 1008, FIG. 13 shows termination resistive packs 1300, 1302, and 1304 coupled to the MAC processor 214. The termination resistive packs 1300-1304 are configured to provide series and parallel termination to the MAC processor 214. Each termination resistive pack provides 4×1 kΩ resistance. In FIG. 14, a resistance and capacitive network comprised of a capacitor 1400 and resistors 1402, 1404 are provided at the TX_GC pinout position of the radio 216. The capacitor 1400 has a capacitance of 330 pF, the resistor 1402 has a resistance of 1.8 kΩ, and the resistor 1404 has a resistance of 1 kΩ. The network is configured to prevent reflection of the signal between the isolation area 502 and the main area 504. A signal coming from the MAC processor 214 crosses the ground plane gap between the two areas and into the radio 216. Thus, although the gap physically prevents interference, electrical connection across the gap is still required without having signal reflection cause signal degradation or device performance.

Other termination circuitry can be provided within the PCB to affect the signal wave shape. The above discussion provides examples of termination circuitry beneficial in the implementation of the device 100 in a single PCB.

With the embedding traces block 1010, the isolation area 502 in the layers 300-900 have alternating layers of ground plane and signal traces throughout the PCB. For example, the layer 400 includes signal traces in the isolation area 502, the layer 500 immediately below does not include any signal traces in the isolation area 502, followed by signal traces in the isolation area 502 of the layer 600. This alternating or sandwiching of the signal traces with a ground plane immediately above and below reduces or prevents signals in the isolation area 502 (e.g., radio signals) from radiating out to other layers of the PCB and to the main area 504. Notice that this technique of embedding the signal traces between ground planes is not necessary in the main area 504.

Figure 5:
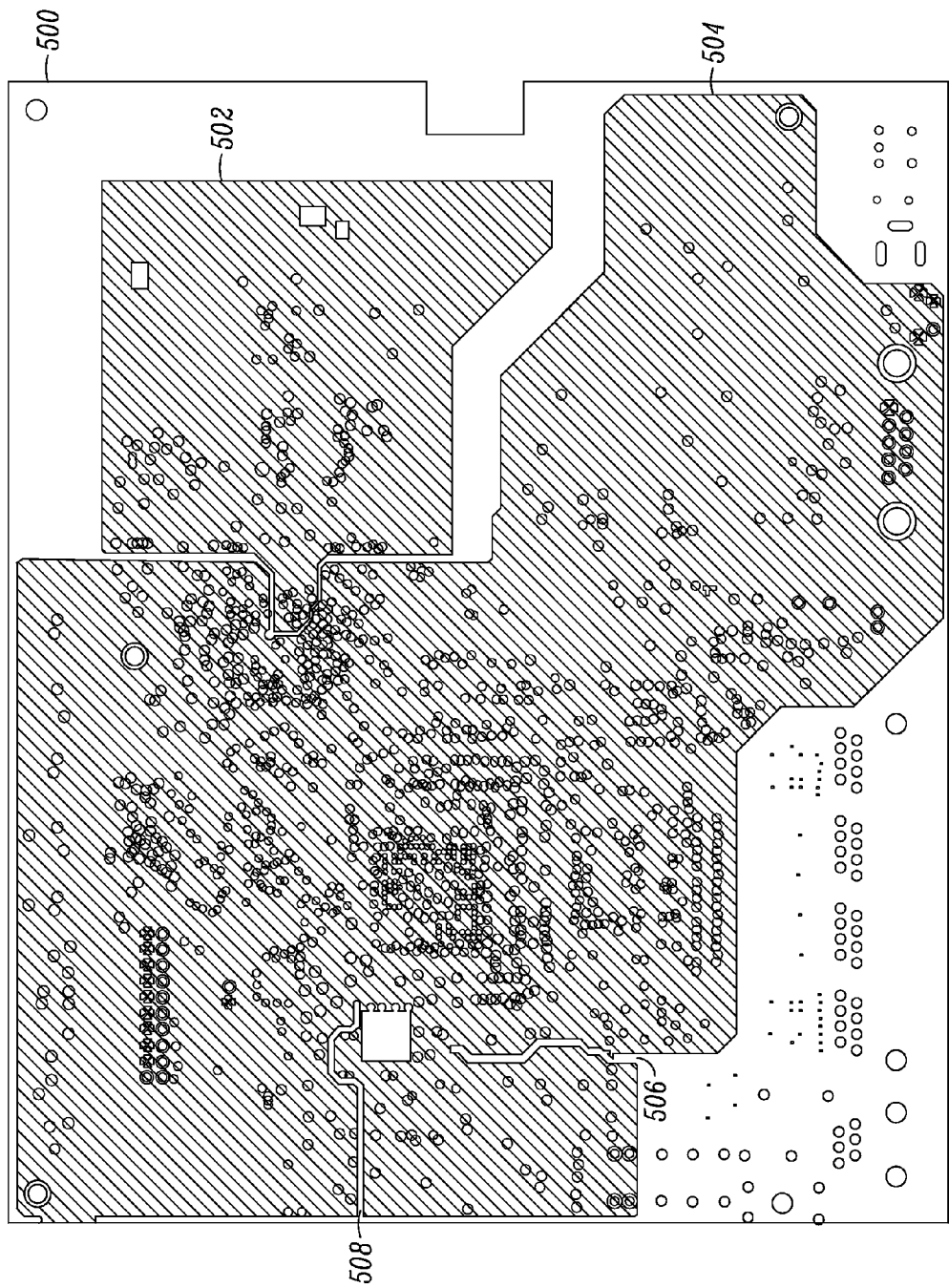
FIG. 5 is a top view of a third layer of the PCB implementation of the DSL device of FIG. 1.

In the ground slotting block 1012, a first ground slot 506 and a second ground slot 508 are provided in the layer 500 of FIG. 5. First and second ground slots 506, 508 are provided at the main area 502 proximate to the ADSL analog front end 204 circuitry and the ADSL clock 202 circuitry. First and second ground slots 506, 508 are physical gaps in the layer 500. First and second ground slots 506, 508 are configured to protect undesirable signals that originated in the isolation area 502 from creeping any further into the ADSL circuitry.

The shape of each of the ground slots 506, 508 depends upon the circuit layout of the ADSL analog front end 204 and the ADSL clock 202. The minimum gap dimension of each of the slots 506, 508 is approximately 0.025 inches.

For the power voltage regulation block 1014, the power generation circuitry for the radio 216 is provided proximate to the radio 216 and within the isolation area 502. Typically, the power generation circuitry is physically located within the power system 106, i.e., lower right quadrant of the PCB. By locating the radio power generation circuitry distal to the power system 106 and the ADSL interface 102, greater control of the RF interferences associated with the radio 216 is possible. Otherwise, the interference could ripple into the radio power generation circuitry and affect the ADSL circuitry.

Figure 15:
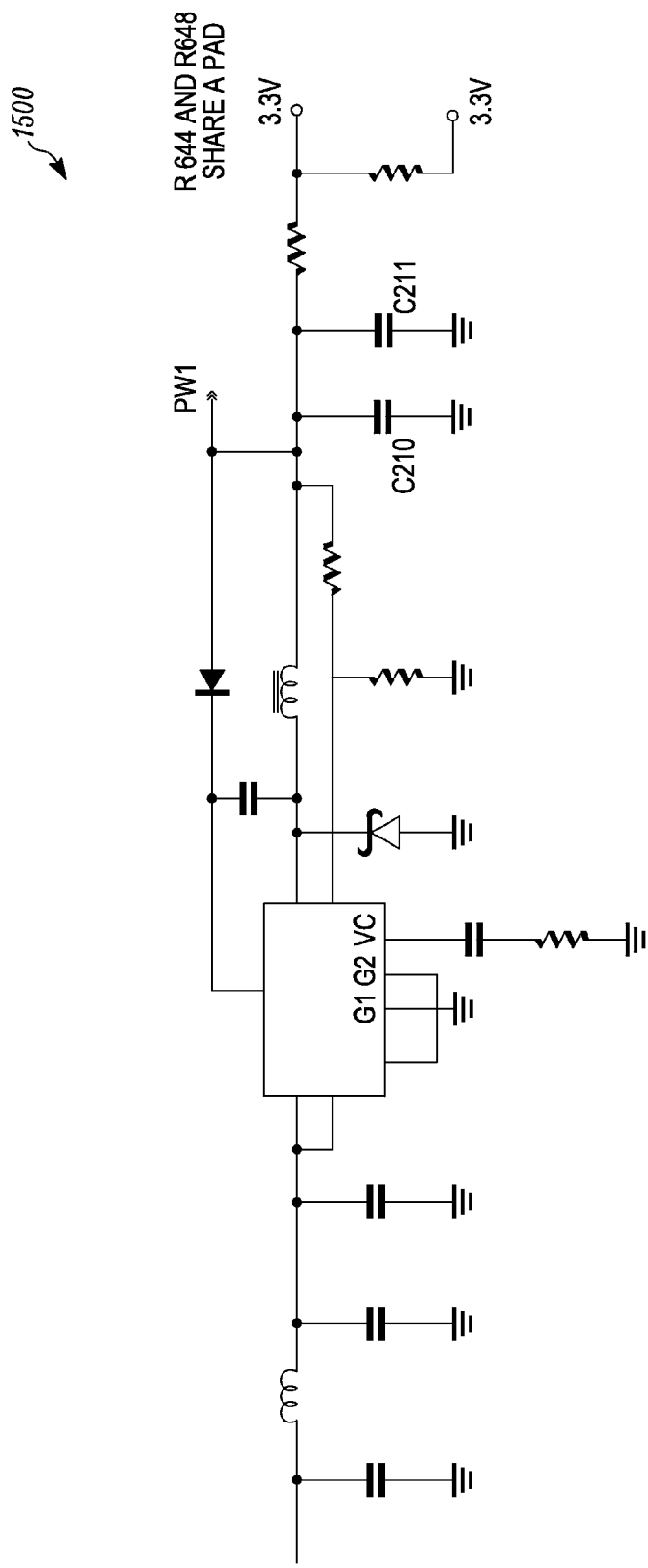
FIG. 15 is a circuit diagram showing power segregation circuitry associated with the DSL device of FIG. 1.

Lastly, in the power supply segregation of loads block 1016, the power system 106 is configured to segregate the overall power being supplied to the isolation area 502 from the overall power being supplied to the main area 504. Referring to FIG. 15, a power supply segregation circuit 1500 is included in the lower right quadrant of the PCB. By separately and directly feeding the ASDL interface 102 and WLAN interface 104, signal interference is prevented from feeding back into the power system 106 and then migrating to the ADSL interface 102.

In this manner, a system and method for providing wireless Internet access at DSL speed without signal interference or performance degradation is provided. By implementing one or more RF interference reduction techniques, the DSL, WLAN, and power system functionalities can be provided in a single PCB. Undesirable RF signals emitted from the wireless radio, power amplifier, and clock are fully isolated and contained, so as to prevent performance degradation in the DSL circuitry. Thus, the wireless capabilities and the DSL capabilities are both preserved while providing greater device integration. As an example, the device 100 can provide approximately 70% of the data transfer at 11 Mbs at a distance of 180 meters.

While the invention has been described in terms of particular embodiments and illustrative figures, those of ordinary skill in the art will recognize that the invention is not limited to the embodiments or figures described. The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art. Therefore, it should be understood that the invention can be practiced with modification and alteration within the spirit and scope of the appended claims. The description is not intended to be exhaustive or to limit the invention to the precise form disclosed.

From the foregoing, it will be appreciated that specific embodiments of the invention have been described herein for purposes of illustration, but that various modifications may be made without deviating form the spirit and scope of the invention. For example, although specific termination circuitry are discussed herein, other circuits or components may be similarly implemented in the circuit board with similar functionality. As another example, as wireless network capabilities expand, greater ranges would be possible with embodiments of the invention described herein. Accordingly, the invention is not limited except as by the appended claims and equivalents thereof.

What is claimed is:

1. An apparatus for providing wireless Internet access, comprising:
    a broadband interface comprising an Asymmetric Digital Subscriber Line (ADSL) modem interface for providing a broadband Internet connection; and
    a wireless interface coupled to the broadband interface, the wireless interface comprising a Wireless Local Area Network (WLAN) interface electrically coupled to the broadband interface, and wherein the broadband and wireless interfaces are provided on a single integrated circuit board.

2. The apparatus of claim 1, further comprising a power interface coupled to each of the broadband interface and the wireless interface.

3. The apparatus of claim 2, wherein the broadband, wireless, and power interfaces are provided on the single integrated circuit board.

4. A method for preventing RF interference in a wireless Internet accessing device comprising a Wireless Local Area Network (WLAN) interface, the method comprising:
    isolating a RF modulator/demodulator from broadband circuitry comprising an Asymmetric Digital Subscriber Line (ADSL) modem interface for providing a broadband Internet connection, the RF modulator/demodulator and the broadband circuitry included in the wireless Internet accessing device,
    wherein isolating the RF modulator/demodulator includes at least one of metal shielding the RF modulator/demodulator, embedding traces associated with the RF modulator/demodulator between ground planes, and providing a circuit board gap between the RF modulator/demodulator and the broadband circuitry.

5. The method of claim 4, further comprising:
    isolating a power supply circuit coupled to the RF modulator/demodulator; and
    separately isolating a broadband clock circuit coupled to the RF modulator/demodulator.

6. The method of claim 5, further comprising:
    matching an impedance of the power amplifier and an antenna included in the wireless Internet accessing device.

7. A wireless network device, comprising:
    a processor;
    a RF transceiver coupled to the processor;
    a clock coupled to each of the processor and the RF transceiver;
    a power amplifier coupled to the RF transceiver; and
    an antenna coupled to the RF transceiver and the power amplifier, wherein the RF transceiver and the power amplifier are encapsulated by a first metal shield and the clock is encapsulated by a second metal shield.

8. The device of claim 7, wherein a thickness of at least one of the first and second metal shield is 0.20 mm.

9. A wireless Internet device, comprising:
    means for accessing the Internet via a telephone line at a rate greater than 56 kbps, means for wirelessly transmitting and receiving data compatible with the Internet over a range of at least approximately 200 meters; and means for preventing RF interference emitted from the means for wirelessly transmitting and receiving from degrading the performance of the means for accessing the Internet by isolating the RF interference within a separate area in an integrated circuit board implementing the wireless Internet device.

10. The device of claim 9, wherein the means for preventing RF interference comprises a ground slot proximate to the means for accessing in a layer of the integrated circuit board.

11. The device of claim 9, wherein the means for preventing RF interference comprises an isolation gap between the means for accessing and the means for wirelessly transmitting in a layer of the integrated circuit board.

12. The device of claim 9, wherein the means for preventing RF interference comprises a metal shield on a portion of a layer of the integrated circuit board.

13. A method for providing wireless Internet access, comprising:

accessing the Internet via a broadband connection using a broadband connection circuit that comprises an Asymmetric Digital Subscriber Line (ADSL) modem interface for providing a broadband Internet connection; and wirelessly communicating with the accessed Internet using a Wireless Local Area Network (WLAN) interface electrically coupled to the ADSL modem interface, wherein accessing the Internet and wirelessly communicating occur via a single integrated circuit board.

14. The method of claim 13, further comprising providing power to access the Internet and wirelessly communicate via the single integrated circuit board.

* * * * *